(12) United States Patent
Wan et al.

(10) Patent No.: US 12,170,201 B2
(45) Date of Patent: Dec. 17, 2024

(54) METHOD FOR PREPARING SEMICONDUCTOR STRUCTURE AND SEMICONDUCTOR STRUCTURE

(71) Applicant: CHANGXIN MEMORY TECHNOLOGIES, INC., Hefei (CN)

(72) Inventors: Qiang Wan, Hefei (CN); Tao Liu, Hefei (CN); Sen Li, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 602 days.

(21) Appl. No.: 17/490,025

(22) Filed: Sep. 30, 2021

(65) Prior Publication Data

US 2022/0278190 A1 Sep. 1, 2022

Related U.S. Application Data

(63) Continuation of application No. PCT/CN2021/107793, filed on Jul. 22, 2021.

(30) Foreign Application Priority Data

Mar. 1, 2021 (CN) .......................... 202110224667.X

(51) Int. Cl.
*H01L 21/033* (2006.01)
*H10B 12/00* (2023.01)
*H01L 49/02* (2006.01)

(52) U.S. Cl.
CPC ...... *H01L 21/0338* (2013.01); *H01L 21/0337* (2013.01); *H01L 28/40* (2013.01); *H10B 12/03* (2023.02)

(58) Field of Classification Search
CPC ....... H01L 21/0334–0338; H01L 28/40; H01L 28/90–92
See application file for complete search history.

(56) References Cited

U.S. PATENT DOCUMENTS

2004/0002189 A1   1/2004   Park

FOREIGN PATENT DOCUMENTS

| CN | 1467826 A | | 1/2004 |
|---|---|---|---|
| CN | 104425220 A | | 3/2015 |
| CN | 107634047 A | | 1/2018 |
| CN | 108538835 A | | 9/2018 |
| CN | 111199875 A | * | 5/2020 |
| CN | 112133625 A | | 12/2020 |
| CN | 113035836 A | | 6/2021 |

* cited by examiner

*Primary Examiner* — Robert G Bachner
*Assistant Examiner* — Molly K Reida
(74) *Attorney, Agent, or Firm* — Syncoda LLC; Feng Ma

(57) ABSTRACT

A method for preparing a semiconductor structure, and a semiconductor structure are provided. In a prepared first pattern structure, a thickness of a first insulating layer is equal to a thickness of a second insulating layer, and a thickness of a third insulating layer is equal to a thickness of a fourth insulating layer.

11 Claims, 15 Drawing Sheets

METHOD FOR PREPARING SEMICONDUCTOR STRUCTURE AND SEMICONDUCTOR STRUCTURE

CROSS-REFERENCE TO RELATED APPLICATIONS

This is a continuation application of International Patent Application No. PCT/CN2021/107793, filed on Jul. 22, 2021, which claims priority to Chinese Patent Application No. 202110224667.X, filed on Mar. 1, 2021 and entitled "METHOD FOR PREPARING SEMICONDUCTOR STRUCTURE AND SEMICONDUCTOR STRUCTURE". The disclosures of International Patent Application No. PCT/CN2021/107793 and Chinese Patent Application No. 202110224667.X are incorporated by reference herein in their entireties.

TECHNICAL FIELD

The disclosure relates to the technical field of integrated circuits, in particular to a method for preparing a semiconductor structure, and a semiconductor structure.

BACKGROUND

With the rapid development of semiconductor storage technology, the market has put forward higher requirements for the storage capacity of a semiconductor storage product. For a capacitive memory, the storage capability and stability of the capacitive memory are restricted by the distribution density of storage capacitors and the storage capacity of a single capacitor.

However, for a conventional capacitive memory, in the process of preparing capacitor holes, it is generally necessary to form two layers of mask patterns. The two layers of mask patterns each include trench structures spaced apart from each other. When viewed from the top, the two layers of mask patterns are arranged obliquely to each other. Then the two layers of mask patterns are transferred to a target mask layer to define the capacitor patterns and prepare the capacitor tubes. In the process of preparing the capacitor tubes, due to the loading effect, the prepared capacitor tubes have defects such as different sizes, insufficient etching, uneven height, and lack of filling materials, which results in a decrease in the storage capacity of the capacitor or electrical failure, thereby further affecting the wafer yield, and severely limiting the possibility of further improving the storage capacity and stability of the capacitive memory.

SUMMARY

According to various embodiments of the disclosure, a method for preparing a semiconductor structure and a semiconductor structure are provided.

One aspect of the disclosure provides a method for preparing a semiconductor structure, which includes the following operations:

A substrate is provided, in which the substrate includes a base, and a first dielectric layer and a first mask layer sequentially formed.

A first mask pattern is formed on the substrate, in which the first mask pattern includes first mask structures spaced apart from each other and first trench structures exposing the substrate, each of the first trench structures is arranged between two adjacent first mask structures, each of the first mask structures includes a first insulating layer and a first patterned photoresist layer, and the first insulating layer is arranged between the first patterned photoresist layer and the first mask layer and covers a portion of a side wall of the first patterned photoresist layer.

A second insulating layer is formed, in which the second insulating layer covers an upper surface of the first mask pattern and a bottom portion and a side wall of each of the first trench structures, and a thickness of the second insulating layer is the same as a thickness of the first insulating layer.

A second mask pattern is formed on the first mask pattern, in which the second mask pattern includes second mask structures spaced apart from each other and second trench structures exposing a portion of the first mask structures, each of the second trench structures is arranged between two adjacent second mask structures, each of the second mask structures includes a third insulating layer and a second patterned photoresist layer, the third insulating layer is arranged between the second patterned photoresist layer and the first mask pattern, and the third insulating layer covers a portion of a side wall of the second patterned photoresist layer.

A fourth insulating layer is formed, in which the fourth insulating layer covers a surface of the second patterned photoresist layer and a bottom portion and a side wall of each of the second trench structures, and a thickness of the fourth insulating layer is the same as a thickness of the third insulating layer.

The second patterned photoresist layer and the fourth insulating layer on a surface of the second patterned photoresist layer are removed to form a first pattern structure.

The first mask pattern, the first mask layer, and a portion of the first dielectric layer are etched by using the first pattern structure as a mask.

Another aspect of the disclosure provides a semiconductor structure, which is prepared by a method for preparing a semiconductor structure. The method for preparing the semiconductor structure includes the following operations:

A substrate is provided, in which the substrate includes a base, and a first dielectric layer and a first mask layer sequentially formed.

A first mask pattern is formed on the substrate, in which the first mask pattern includes first mask structures spaced apart from each other and first trench structures exposing the substrate, each of the first trench structures is arranged between two adjacent first mask structures, each of the first mask structures includes a first insulating layer and a first patterned photoresist layer, and the first insulating layer is arranged between the first patterned photoresist layer and the first mask layer and covers a portion of a side wall of the first patterned photoresist layer.

A second insulating layer is formed, in which the second insulating layer covers an upper surface of the first mask pattern and a bottom portion and a side wall of each of the first trench structures, and a thickness of the second insulating layer is the same as a thickness of the first insulating layer.

A second mask pattern is formed on the first mask pattern, in which the second mask pattern includes second mask structures spaced apart from each other and second trench structures exposing a portion of the first mask structures, each of the second trench structures is arranged between two adjacent second mask structures, each of the second mask structures includes a third insulating layer and a second patterned photoresist layer, the third insulating layer is arranged between the second patterned photoresist layer and the first mask pattern, and the third insulating layer covers a portion of a side wall of the second patterned photoresist layer.

A fourth insulating layer is formed, in which the fourth insulating layer covers a surface of the second patterned photoresist layer and a bottom portion and a side wall of each of the second trench structures, and a thickness of the fourth insulating layer is the same as a thickness of the third insulating layer.

The second patterned photoresist layer and the fourth insulating layer on a surface of the second patterned photoresist layer are removed to form a first pattern structure.

The first mask pattern, the first mask layer, and a portion of the first dielectric layer are etched by using the first pattern structure as a mask.

BRIEF DESCRIPTION OF THE DRAWINGS

In order to describe the technical solutions in embodiments of the disclosure or in conventional technology more clearly, the accompanying drawings required to be used in the embodiments of the disclosure or the conventional technology will be simply introduced below. Apparently, the accompanying drawings in the following description show merely some embodiments of the disclosure, and a person of ordinary skill in the art may still derive other accompanying drawings from these accompanying drawings without creative effort.

FIG. 21A and FIG. 21B illustrate a top view and a schematic sectional diagram of a structure obtained in S7 in a method for preparing a semiconductor structure according to an embodiment of the disclosure, in which FIG. 21B is a schematic sectional diagram along an A-A' direction shown in FIG. 21A.

DETAILED DESCRIPTION

Figure 1:
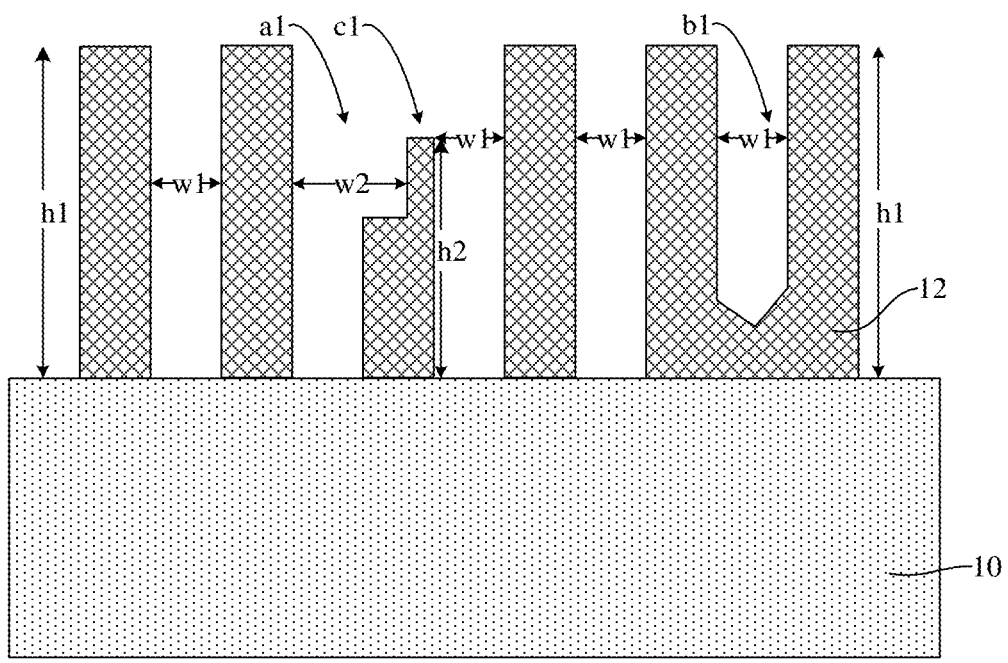
FIG. 1 illustrates a schematic sectional diagram of a target mask formed through a conventional double patterning technology.

In order to facilitate understanding of the disclosure, the disclosure will be described more fully hereinafter with reference to accompanying drawings. Preferred embodiments of the disclosure are illustrated in the accompanying drawings. However, the disclosure may be embodied in many different forms and is not limited to the embodiments described herein. Rather, these embodiments are provided for the purpose of making a disclosure of the disclosure comprehensive.

Unless defined otherwise, all technical and scientific terms used herein have the same meaning as commonly understood by those skilled in the art to which the disclosure belongs. The terminology used in the specification of the disclosure is for a purpose of describing specific embodiments only and is not intended to limit the disclosure. The term "and/or" used herein includes any and all combinations of one or more of the associated listed items.

It should be understood that when elements or layers are referred to as "on", "adjacent to", "connected to" or "coupled to" other elements or layers, it may be directly on, adjacent to, connected to, of coupled to other elements or layers, or intermediate elements or layers may present. On the contrary, when the element is called "directly on", "directly adjacent to", "directly connected to" or "directly coupled to" other elements or layers, there is no intermediate element or layer. It should be understood that, although the terms first, second and third may be used to describe elements, components, areas, layers and/or parts, those elements, components, areas, layers and/or parts should not be limited by those terms. These terms are used only to distinguish one element, component, area, layer or part from another element, component, area, layer or part. Thus, the first element, component, area, layer or part discussed below may be represented a second element, component, area, layer or part without departing from the teaching of the disclosure.

Spatially relational terms such as "below", "under", "lower", "beneath", "on", and "upper" may be used herein for convenience of description to describe the relationship between an element or feature shown in the drawings and other elements or features. It should be understood that, other than the orientation shown in the figures, the spatially relational terms includes different orientations of the devices in use and operation. For example, if the device in the drawings is reversed, then elements or features described as "under other elements", or "below", or "beneath" will be oriented to "above" other elements or features. Therefore, the exemplary terms "under" and "below" may include both upper and lower orientations. The devices may be otherwise oriented (rotated by 90 degrees or other orientations) and the spatial descriptors used herein are interpreted accordingly.

The term used herein is intended only to describe specific embodiments and is not a limitation of the disclosure. In this case, the singular forms "a/an", "one", and "the/said" are also intended to include the plural forms, unless the context clearly indicates otherwise. The terms "composition" and/or "including" shall also be understood and, when used in the specification, the presence of the features, integers, steps, operations, elements, and/or components described, without rule out the presence or addition of one or more other features, integers, steps, operations, elements, components and/or groups thereof. When used herein, the term "and/or" includes any and all combinations of the associated listed items.

Embodiments of the disclosure are described herein with reference to cross-sectional illustrations of schematic representations of the preferred embodiments (and intermediate structures) of the disclosure. Thus, variations from the shapes shown may be expected as a result, for example, of manufacturing techniques and/or tolerance. Therefore, embodiments of the disclosure shall not be limited to the specific shape of the regions illustrated herein, but shall include variations in the shape, for example, a shape variation due to manufacturing. The regions shown in the figures are therefore schematic in nature and their shapes are not intended to shown the actual shapes of regions of the device and are not intended to limit the scope of the disclosure.

Referring to FIG. 1, in the process of defining a capacitor tube pattern by using the conventional double patterning technology, such as Self-Aligned Double Patterning (SADP) technology, due to the loading effect, the capacitor tubes formed after the capacitor image transfer have defects such as different sizes (as illustrated by a1 in FIG. 1), insufficient etching (as illustrated by b1 in FIG. 1), uneven height (as illustrated by c1 in FIG. 1), and lack of filling materials such as GeSi material, which results in a decrease in the storage capacity of the capacitor or electrical failure, thereby further affecting the wafer yield, and severely limiting the possibility of further improving the storage capacity and stability of a capacitive memory. A width w1 is less than a width w2, and a height h2 is less than a height h1. Therefore, the disclosure provides a method for preparing a semiconductor structure and a semiconductor structure, so as to improve the uniformity of the prepared capacitor tubes, the stability of the storage capacity, and the wafer yield.

Referring to FIG. 2 to FIG. 21B, it should be noted that the drawings provided in the embodiment below are merely illustrate the basic concept of the disclosure in a schematic manner. The drawings merely show the components related to the disclosure, rather than the numbers, shapes and sizes of components in actual implementation. In the actual implementation, the type, quantity and proportion of each component may be changed arbitrarily, and the layout of the components may be more complicated.

Figure 2:
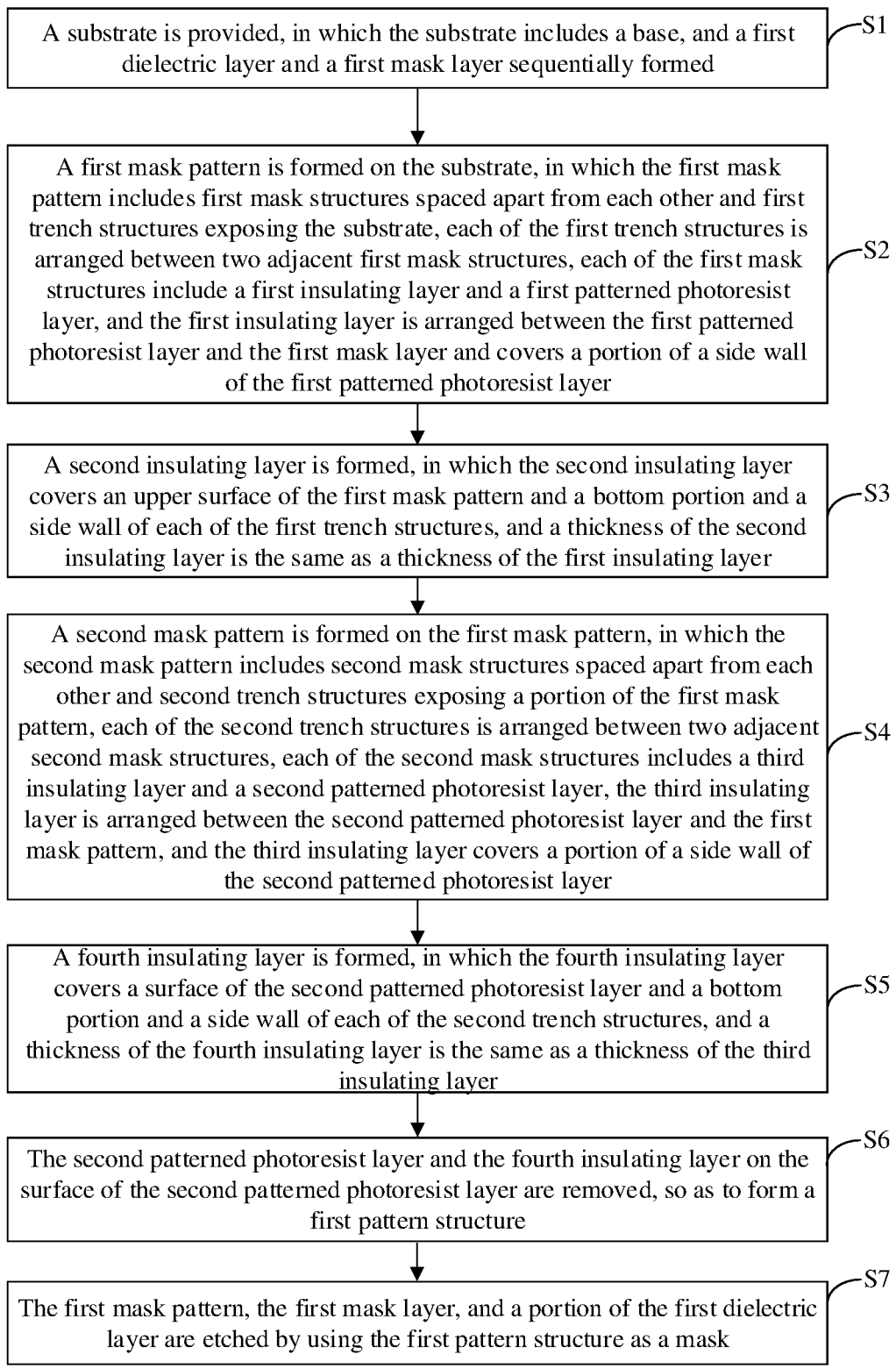
FIG. 2 illustrates a flowchart of a method for preparing a semiconductor structure according to an embodiment of the disclosure.

Referring to FIG. 2, one embodiment of the disclosure provides a method for preparing a semiconductor structure, which includes the following operations.

In S1, a substrate is provided, in which the substrate includes a base, and a first dielectric layer and a first mask layer sequentially formed.

In S2, a first mask pattern is formed on the substrate, in which the first mask pattern includes first mask structures spaced apart from each other and first trench structures exposing the substrate, each of the first trench structure is arranged between two adjacent first mask structures, each of the first mask structures includes a first insulating layer and a first patterned photoresist layer, and the first insulating layer is arranged between the first patterned photoresist layer and the first mask layer and covers a portion of a side wall of the first patterned photoresist layer.

In S3, a second insulating layer is formed, in which the second insulating layer covers an upper surface of the first mask pattern and a bottom portion and a side wall of each of the first trench structures, and a thickness of the second insulating layer is the same as a thickness of the first insulating layer.

In S4, a second mask pattern is formed on the first mask pattern, in which the second mask pattern includes second mask structures spaced apart from each other and second trench structures exposing a portion of the first mask structures, each of the second trench structures is arranged between two adjacent second mask structures, each of the second mask structures includes a third insulating layer and a second patterned photoresist layer, and the third insulating layer is arranged between the second patterned photoresist layer and the first mask pattern, and the third insulating layer covers a portion of a side wall of the second patterned photoresist layer.

In S5, a fourth insulating layer is formed, in which the fourth insulating layer covers a surface of the second patterned photoresist layer and a bottom portion and a side wall of each of the second trench structures, and a thickness of the fourth insulating layer is the same as a thickness of the third insulating layer.

In S6, the second patterned photoresist layer and the fourth insulating layer on a surface of the second patterned photoresist layer are removed to form a first pattern structure.

In S7, the first mask pattern, the first mask layer, and a portion of the first dielectric layer are etched by using the first pattern structure as a mask.

Figure 3:
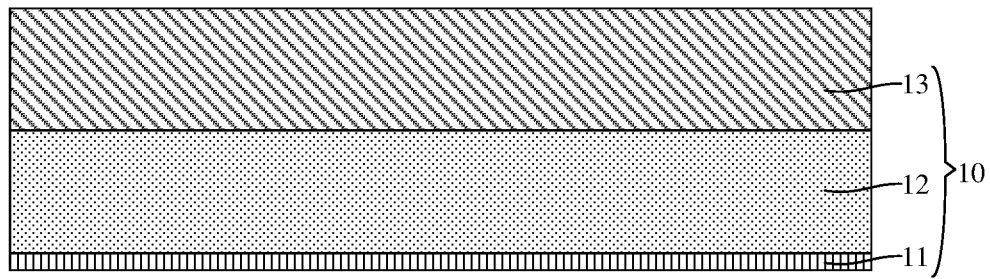
FIG. 3 illustrates a schematic sectional diagram of a structure obtained in S1 in a method for preparing a semiconductor structure according to an embodiment of the disclosure.
Figure 4:
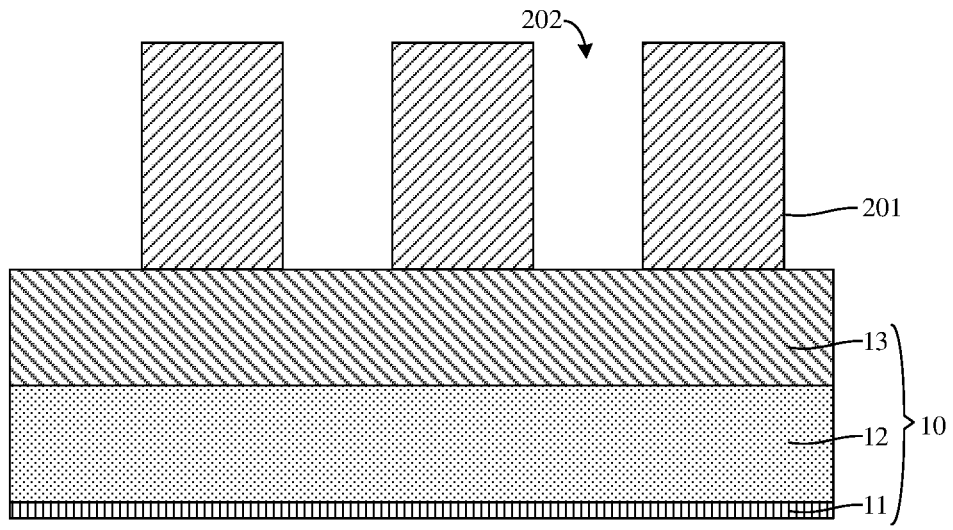
FIG. 4 to FIG. 8 illustrate schematic sectional diagrams of structures obtained in S2 in a method for preparing a semiconductor structure according to an embodiment of the disclosure.

In S1, referring to S1 in FIG. 2, and FIG. 3, a substrate 10 is provided. The substrate 10 includes a base 11, a first dielectric layer 12 and a first mask layer 13 sequentially stacked onto one another.

As an example, the base 11 may include a word line structure, a bit line structure, a capacitive contact structure, etc., which are irrelevant to this solution and thus are omitted. The first dielectric layer 12 may include multiple layers, and the first mask layer 13 may include multiple layers. The first mask layer 13 can be used to transfer a pattern for preparing the capacitor holes. The first dielectric layer 12 is etched by using the patterned first mask layer after transferring the pattern as a mask, so as to form the capacitor hole structure. The first dielectric layer 12 may include a first support layer, a second dielectric layer, a second support layer, a third dielectric layer, and a third support layer sequentially stacked onto one another. The first support layer includes, but is not limited to, a silicon boron nitride (SiBN) layer, the second dielectric layer includes, but is not limited to, a Boro Phospho Silicate Glass (BPSG) layer, the second support layer includes, but is not limited to, a silicon carbon nitride (SiCN) layer, the third dielectric layer includes, but is not limited to, a High Density Plasma (HDP) layer, and the third support layer includes, but is not limited to, a silicon carbon nitride (SiCN) layer. In the process of etching the first dielectric layer 12, the third support layer, the third dielectric layer, the second support layer, the second dielectric layer, and the first support layer are sequentially etched, so as to form the etching holes as the capacitor holes. The size of each capacitor hole is the same. When the capacitor holes are circular capacitor holes, the diameter of each capacitor hole is equal to each other.

As an example, continuing to refer to S2 in FIG. 2, and FIG. 4 to FIG. 8, in S2, the operation that the first mask pattern is formed on the substrate 10 includes the following operations.

In S22, a first sacrificial layer 201 is formed on the substrate 10. The first sacrificial layer 201 includes third trench structures 202 exposing a first mask layer 13.

In S24, a first initial insulating layer 2111 is formed. The first initial insulating layer 2111 covers an upper surface of the first sacrificial layer 201 and a bottom portion and a side wall of each of the third trench structures 202.

In S26, a first photoresist layer 2121 is formed. The first photoresist layer 2121 covers a surface of the first initial insulating layer 2111 and fills the third trench structures 202.

In S28, the first photoresist layer 2121 is patterned, so as to form the first patterned photoresist layer 212.

In S210, a portion of the first initial insulating layer 2111 and the first sacrificial layer 201 are etched by using the first patterned photoresist layer 212 as a mask, so as to form each of the first trench structures 22. A remaining portion of the first initial insulating layer 2111 forms the first insulating layer 211.

Figure 5:
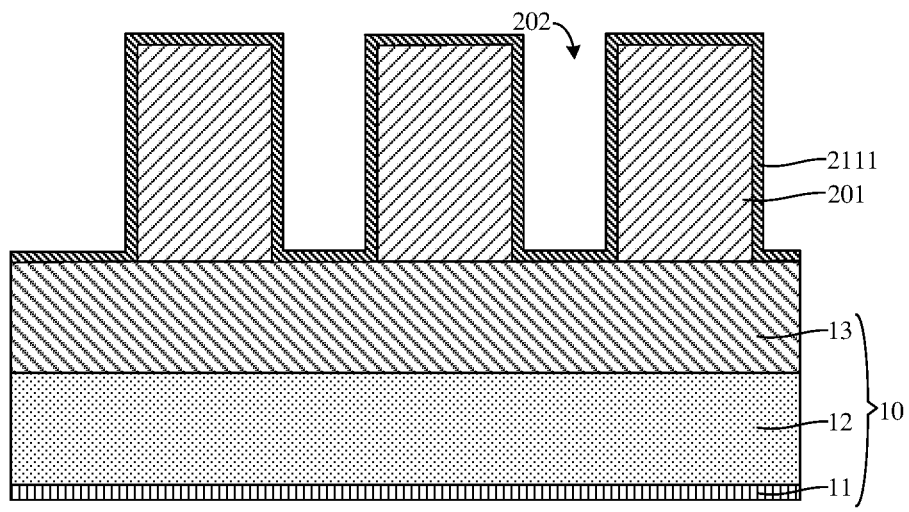

As an example, continuing to refer to FIG. 5, in one embodiment of the disclosure, the operation that the first initial insulating layer 2111 is formed includes the following operation.

In S241, the first initial insulating layer 2111 is formed through an atomic layer deposition process. A material of the first initial insulating layer 2111 includes silicon oxide.

Figure 6:
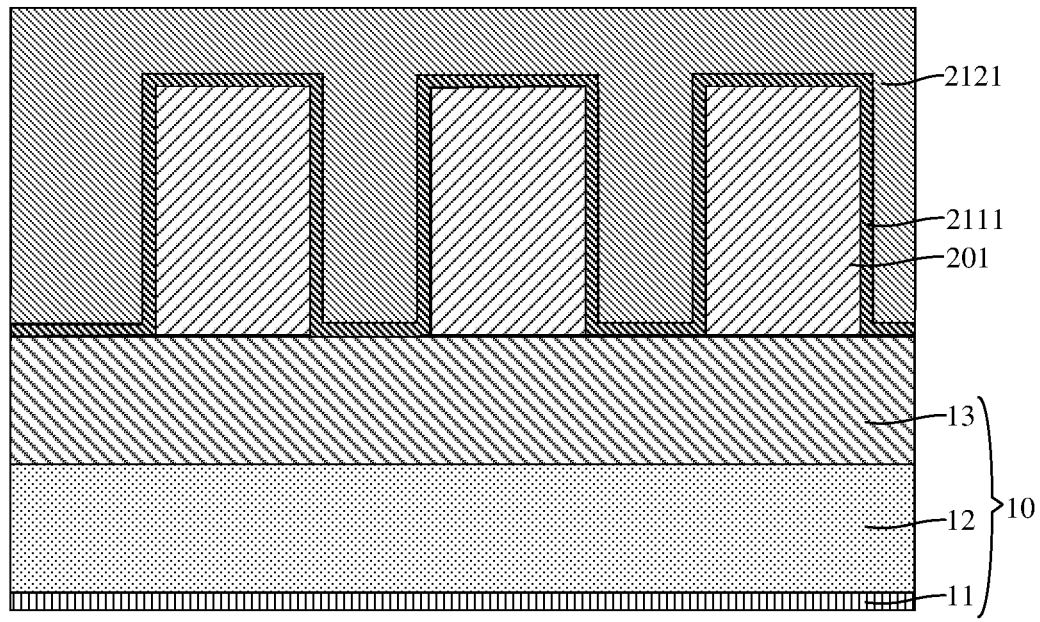
Figure 7:
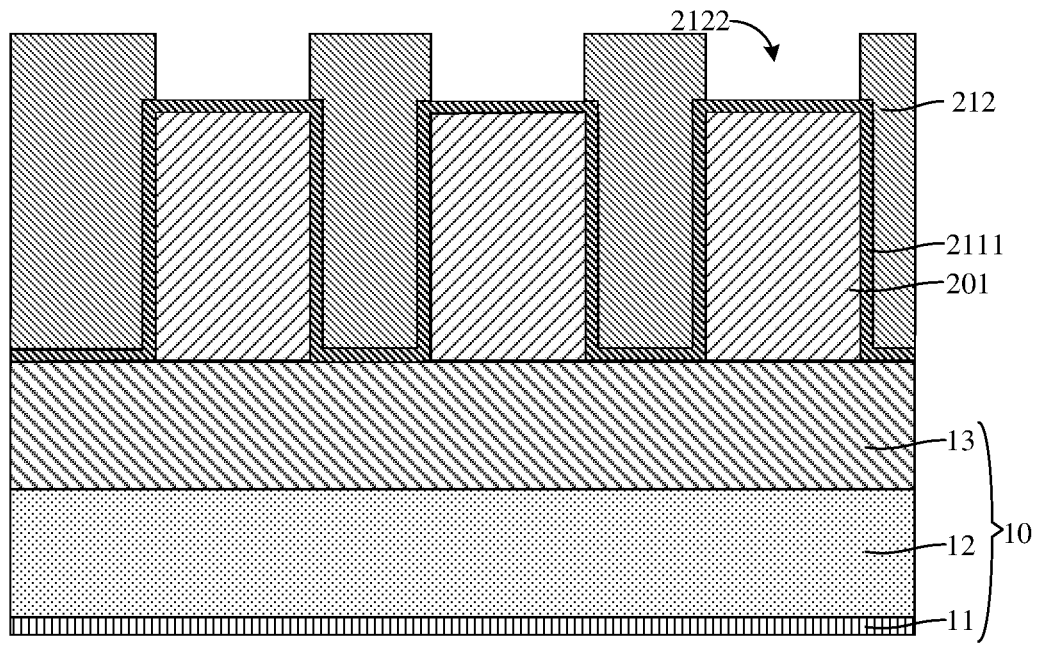

As an example, continuing to refer to FIG. 6, in one embodiment of the disclosure, the operation that the first photoresist layer 2121 is formed includes the following operation.

In S261, the surface of the first initial insulating layer 2111 is coated with the first photoresist layer 2121. The first photoresist layer 2121 covers the surface of the first initial insulating layer 2111 and fills the third trench structures 202.

As an example, in one embodiment of the disclosure, the first photoresist layer 2121 includes, but is not limited to, an N-type photoresist layer. As an example, in one embodiment of the disclosure, continuing to refer to FIG. 7, the operation that the first patterned photoresist layer 212 is formed includes the following operation.

In S282, the first photoresist layer 2121 is treated through microwave vibration, so as to form the first patterned photoresist layer 212. First openings 2122 are formed in the first patterned photoresist layer 212. The first openings 2122 are configured to define the positions and shapes of the first trench structures 22.

Figure 8:
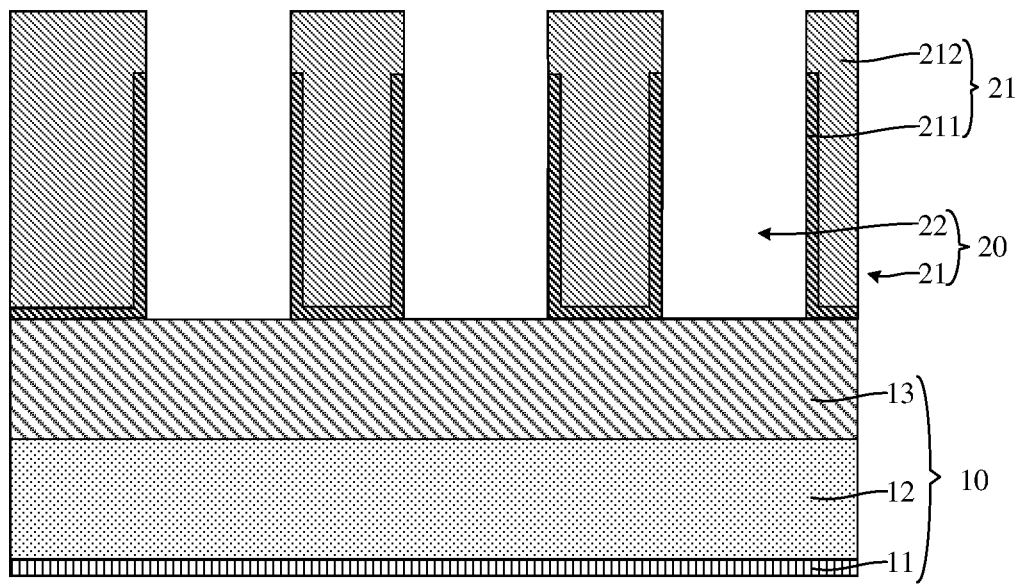

As an example, in one embodiment of the disclosure, continuing to refer to FIG. 8, the operation that the first trench structures 22 are formed includes the following operation.

In S211, a portion of the first initial insulating layer 2111 and the first sacrificial layer 201 are etched through a dry etching process by using the first patterned photoresist layer 212 as a mask, so as to form the first trench structures 22. A remaining portion of the first initial insulating layer 2111 forms the first insulating layer 211.

Figure 9:
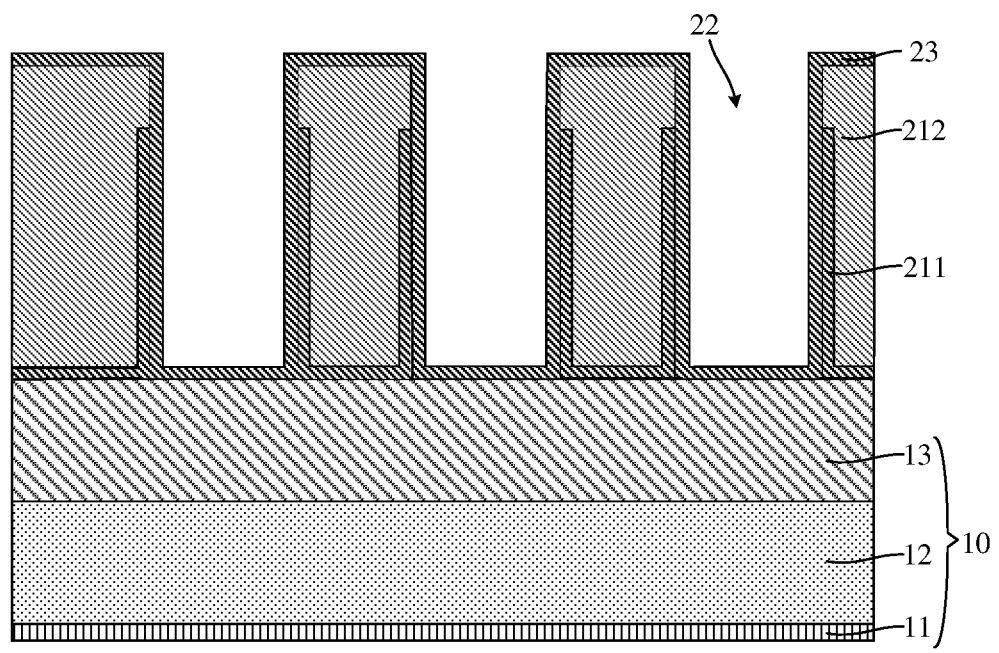
FIG. 9 to FIG. 11 illustrate schematic sectional diagrams of structures obtained in S3 in a method for preparing a semiconductor structure according to an embodiment of the disclosure.

As an example, continuing to refer to FIG. 9, in one embodiment of the disclosure, the operation that the second insulating layer 23 is formed includes the following operation.

In S32, the second insulating layer 23 is formed through an atomic layer deposition process. A material of the second insulating layer 23 includes silicon oxide.

Figure 10:
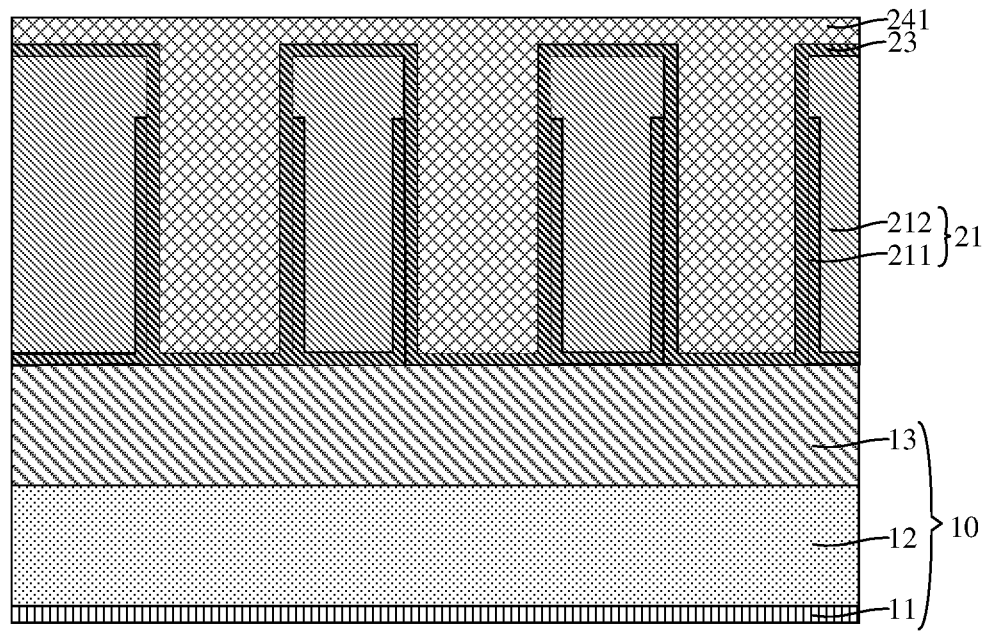

As an example, referring to FIG. 10, in one embodiment of the disclosure, after S3 and before S4, the method further includes the following operation.

In S33, a first filling material layer 241 is formed. The first filling material layer 241 covers a surface of the second insulating layer 23, and the first filling material layer 241 and the second insulating layer 23 fill the first trench structures 22.

Figure 11:
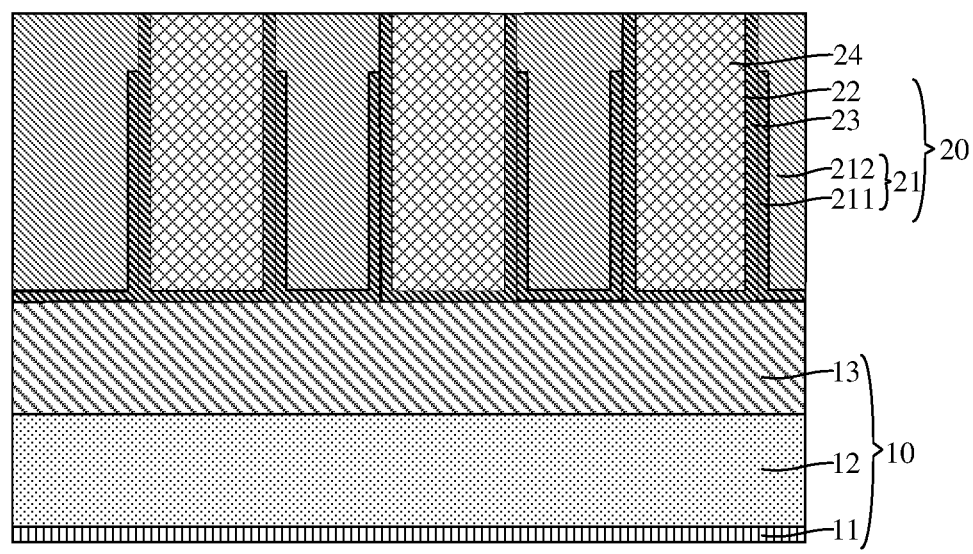

As an example, referring to FIG. 11, in one embodiment of the disclosure, after S33 and before S4, the method further includes the following operation.

In S34, a portion of the first filling material layer 241 and the second insulating layer 23 on an upper surface of the first patterned photoresist layer 212 are removed, so as to form a first filling layer 24. An upper surface of the first filling layer 24 is flush with the upper surface of the first patterned photoresist layer 212. As an example, the formation process of the first filling material layer 241 may be one or more of a Chemical Vapor Deposition (CVD) process, an Atomic Layer Deposition (ALD) process, a High Density Plasma (HDP) deposition process, or a plasma-enhanced deposition process. Preferably, in the disclosure, the first filling material layer 241 is formed through the HDP deposition process. The first filling material layer 241 may include, but is not limited to, a Spin-On Hardmask (SOH) layer. The SOH layer may include an amorphous carbon layer or an amorphous silicon layer.

As an example, continuing to refer to FIG. 11, in one embodiment of the disclosure, a portion of the first filling material layer 241 and the second insulating layer 23 on the upper surface of the first patterned photoresist layer 212 are removed through a dry etching process. A remaining portion of the first filling material layer 241 forms the first filling layer 24, such that an upper surface of the first filling layer 24 is flush with the upper surface of the first patterned photoresist layer 212.

Figure 12:
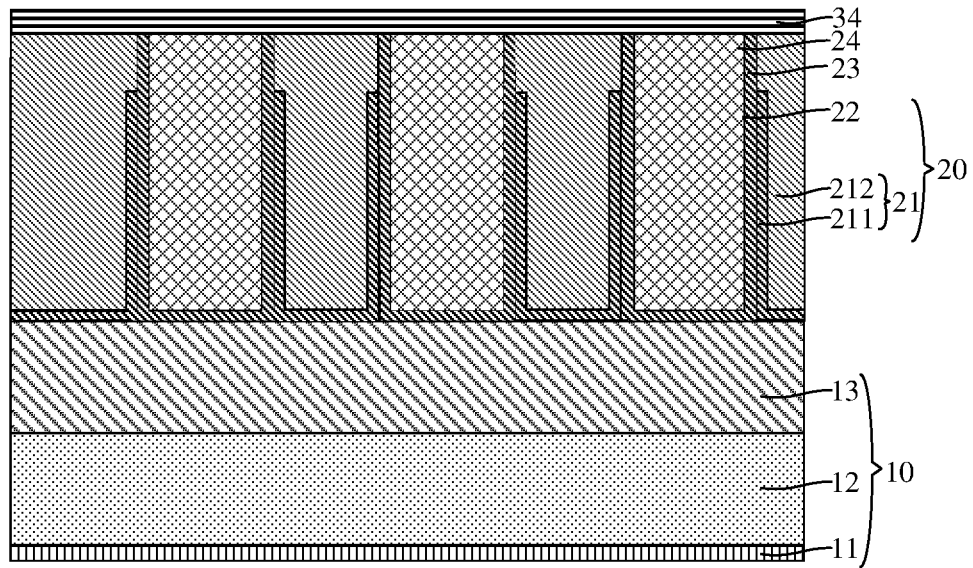
FIG. 12 to FIG. 17 illustrate schematic sectional diagrams of structures obtained in S4 in a method for preparing a semiconductor structure according to an embodiment of the disclosure.
Figure 13:
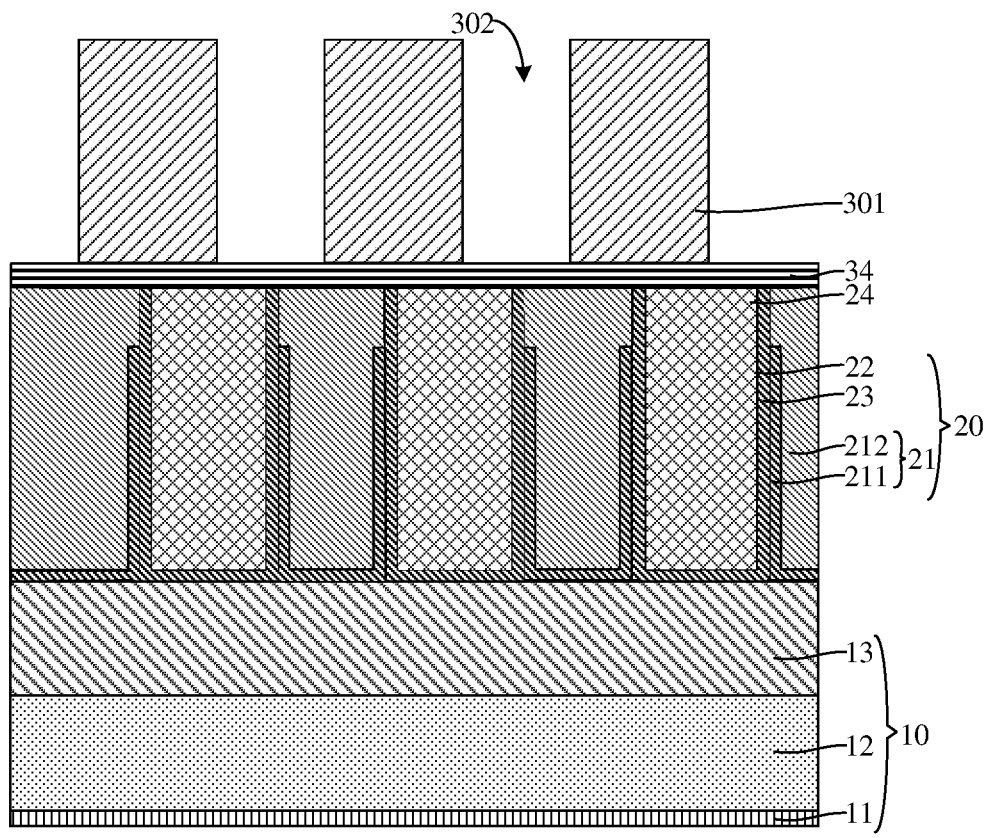

As an example, referring to FIG. 12, in one embodiment of the disclosure, after the operation that the first filling layer 24 is formed, and before the operation that the second mask pattern 30 is formed on the first mask pattern 20, the method further includes the following operation.

In S35, a first polysilicon layer 34 is formed on the first filling layer 24. The first polysilicon layer 34 covers the upper surface of the first filling layer 24 and the upper surface of the first patterned photoresist layer 212.

As an example, referring to FIG. 13 to FIG. 17, in one embodiment of the disclosure, S4 includes the following operations.

In S42, a second sacrificial layer 301 is formed on the first polysilicon layer 34. The second sacrificial layer includes fourth trench structures 302 exposing the first polysilicon layer 34.

In S44, a second initial insulating layer 3111 is formed. The second initial insulating layer 3111 covers an upper surface of the second sacrificial layer 301 and a bottom portion and a side wall of each of the fourth trench structures 302.

In S46, a second photoresist layer 3121 is formed. The second photoresist layer 3121 covers a surface of the second initial insulating layer 3111 and fills the fourth trench structures 302.

In S48, the second photoresist layer 3121 is patterned, so as to form the second patterned photoresist layer 312.

In S410, a portion of the second initial insulating layer 3111 and the second sacrificial layer 301 are etched by using the second patterned photoresist layer 312 as a mask. A remaining portion of the second initial insulating layer 3111 forms the third insulating layer 311.

Figure 14:
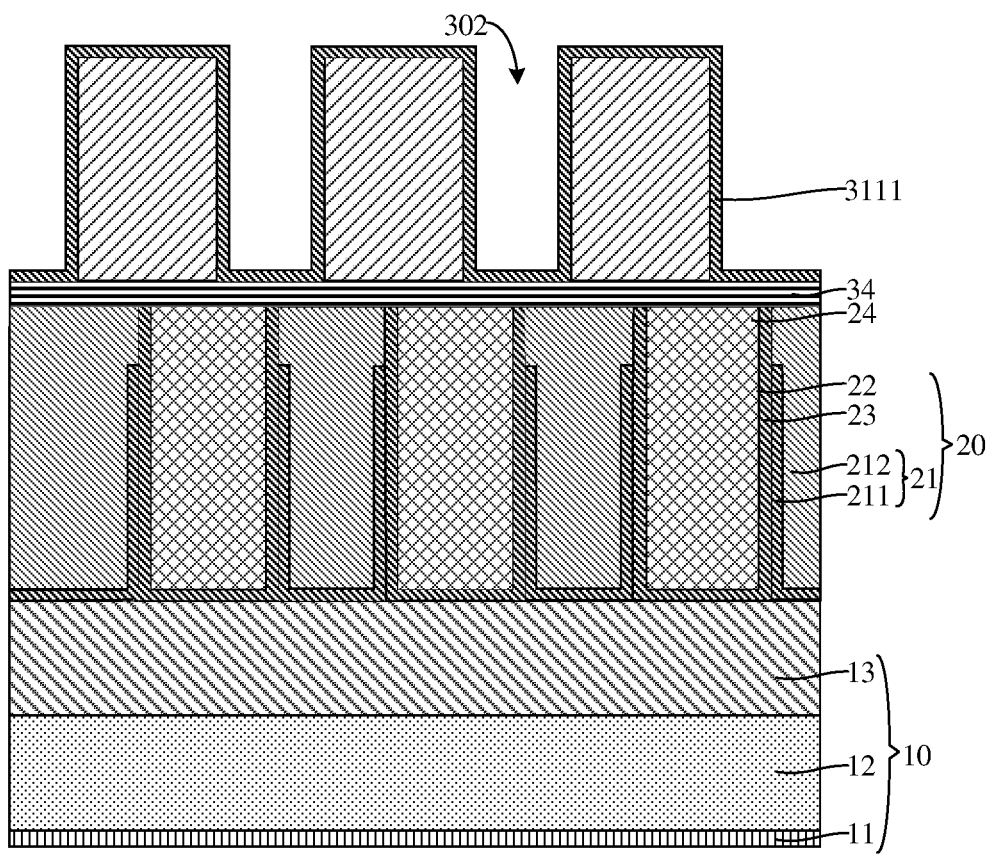

As an example, referring to FIG. 14, in one embodiment of the disclosure, the operation that the second initial insulating layer 3111 is formed includes the following operation.

The second initial insulating layer 3111 is formed through an atomic layer deposition process. A material of the second initial insulating layer 3111 includes silicon oxide.

As an example, continuing to refer to FIG. 14, in one embodiment of the disclosure, the etching selectivity ratio of the second initial insulating layer 3111 to the first polysilicon layer 34 is greater than 10:1 under a same etching condition, so as to effectively mitigate the loading effect in the patterns defined by double patterning.

Figure 15:
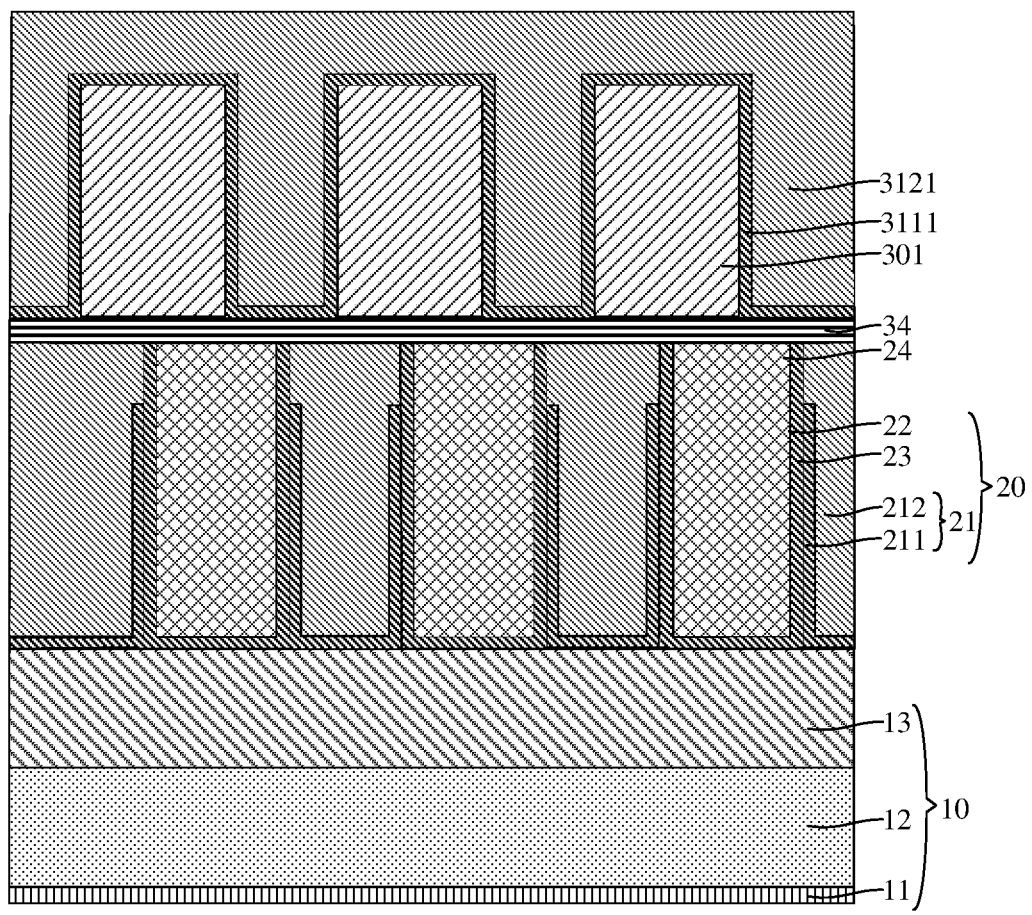
Figure 16:
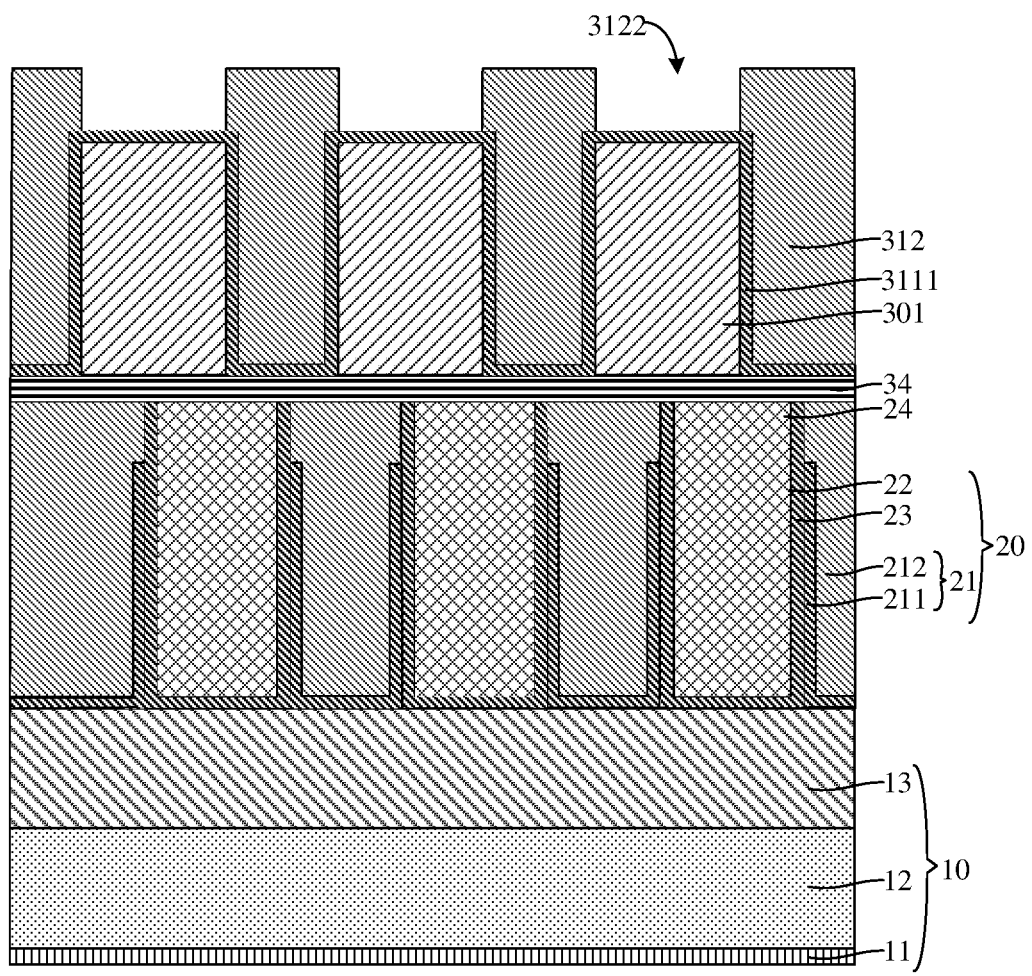

As an example, in one embodiment of the disclosure, continuing to refer to FIG. 15 and FIG. 16, the operation that the second patterned photoresist layer 312 is formed includes the following operation.

In S482, the second photoresist layer 3121 is treated through microwave vibration, so as to form the second patterned photoresist layer 312. Second openings 3122 are formed in the second patterned photoresist layer 312. The second openings 3122 are configured to define the positions and shapes of the second trench structures 32.

Figure 17:
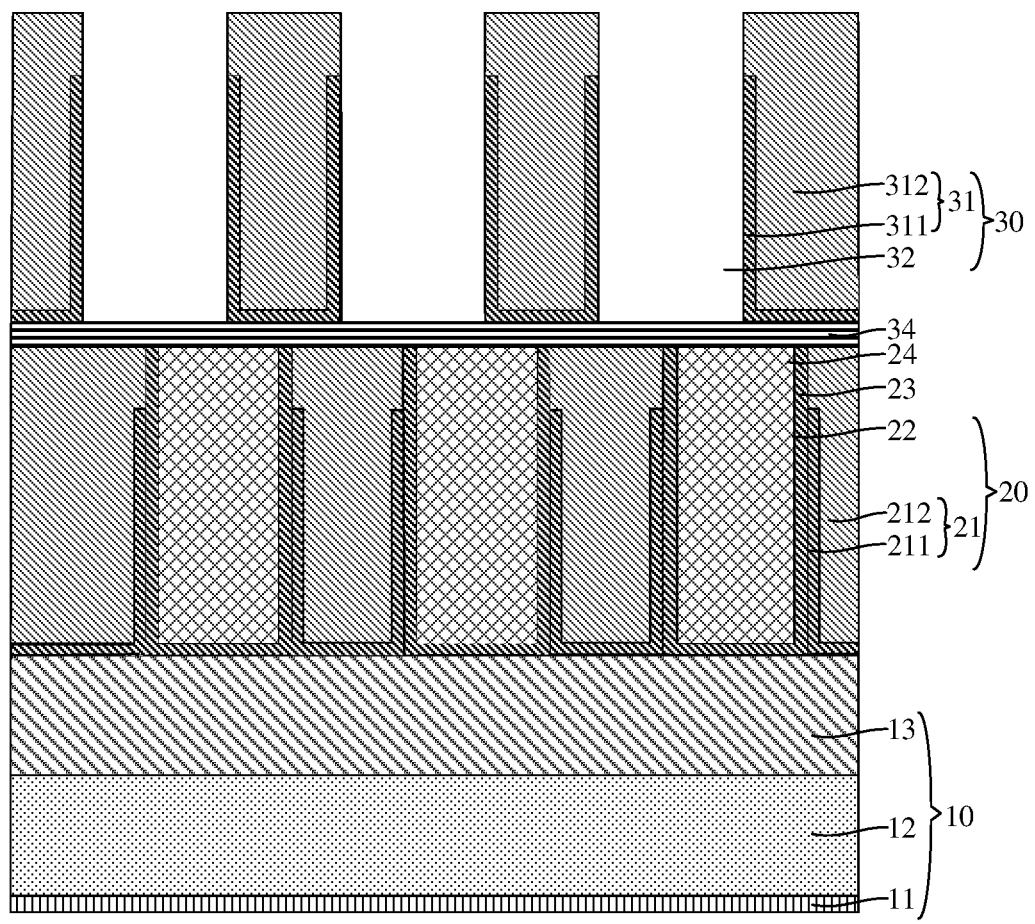
Figure 18:
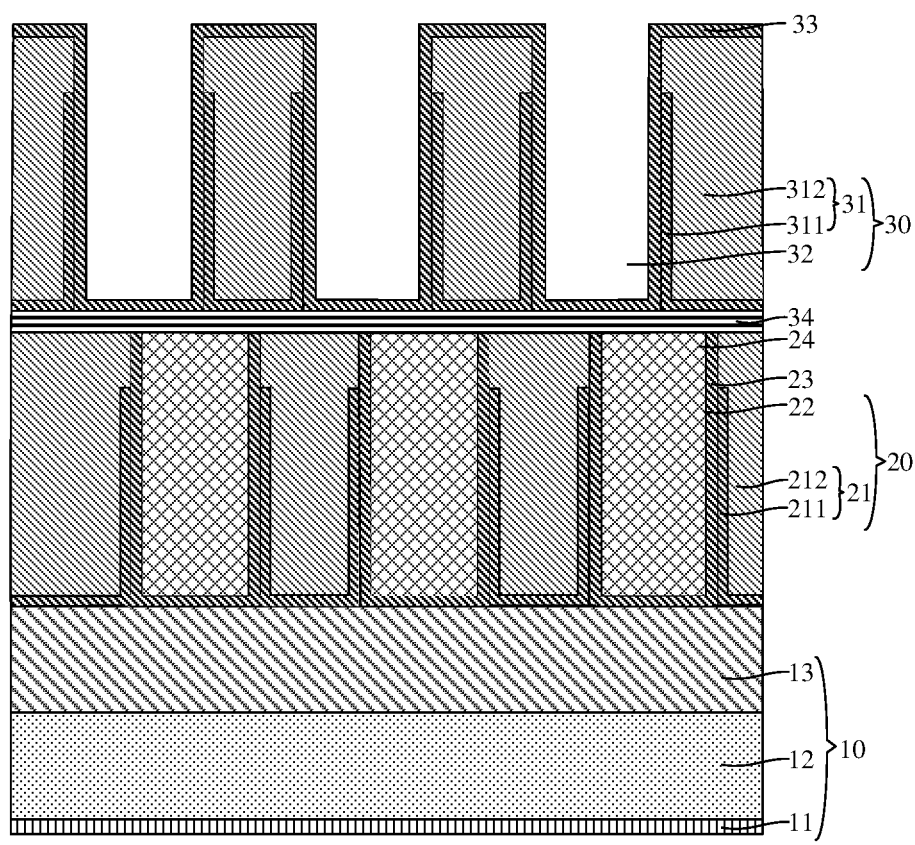
FIG. 18 illustrates a schematic sectional diagram of a structure obtained in S5 in a method for preparing a semiconductor structure according to an embodiment of the disclosure.

As an example, referring to FIG. 17 and FIG. 18, in one embodiment of the disclosure, the operation that the fourth insulating layer 33 is formed includes the following operation.

In S52, the fourth insulating layer 33 is formed through an atomic layer deposition process. A material of the fourth insulating layer 33 includes silicon oxide.

Figure 19:
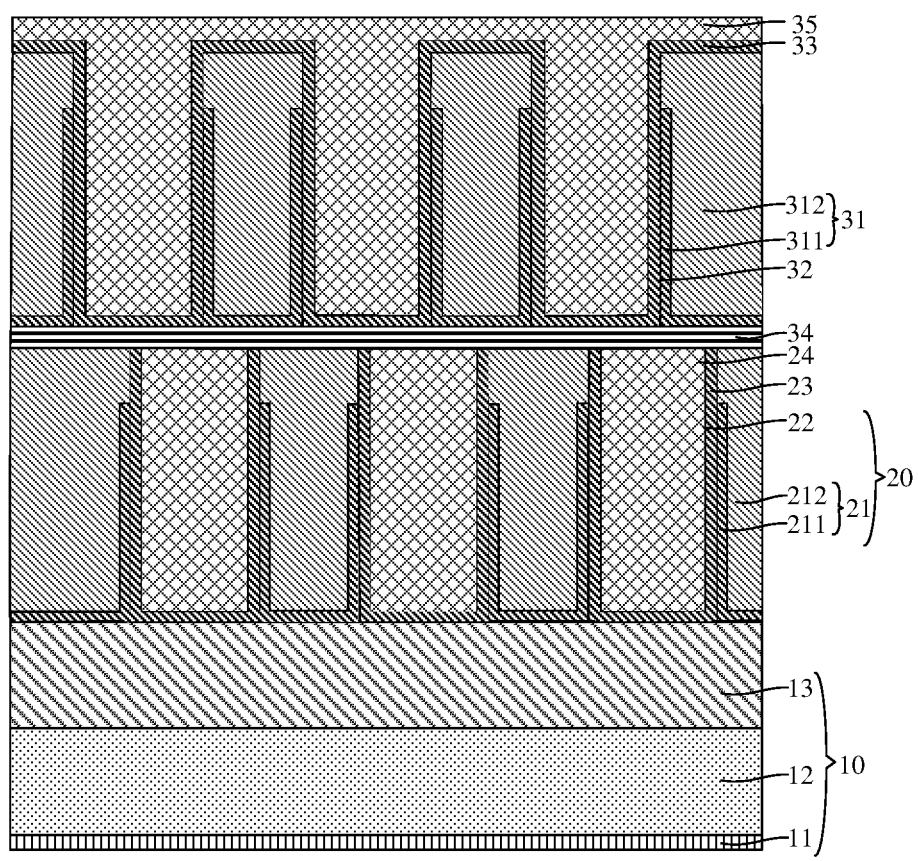
FIG. 19 and FIG. 20 illustrate schematic sectional diagrams of structures obtained in S6 in a method for preparing a semiconductor structure according to an embodiment of the disclosure.

As an example, referring to FIG. 19, in one embodiment of the disclosure, before S6, the method further includes the following operation.

In S53, a second filling layer 35 is formed. The second filling layer 35 covers the surface of the fourth insulating layer 33, and the second filling layer 35 and the fourth insulating layer 33 fill the second trench structures 32.

Figure 20:
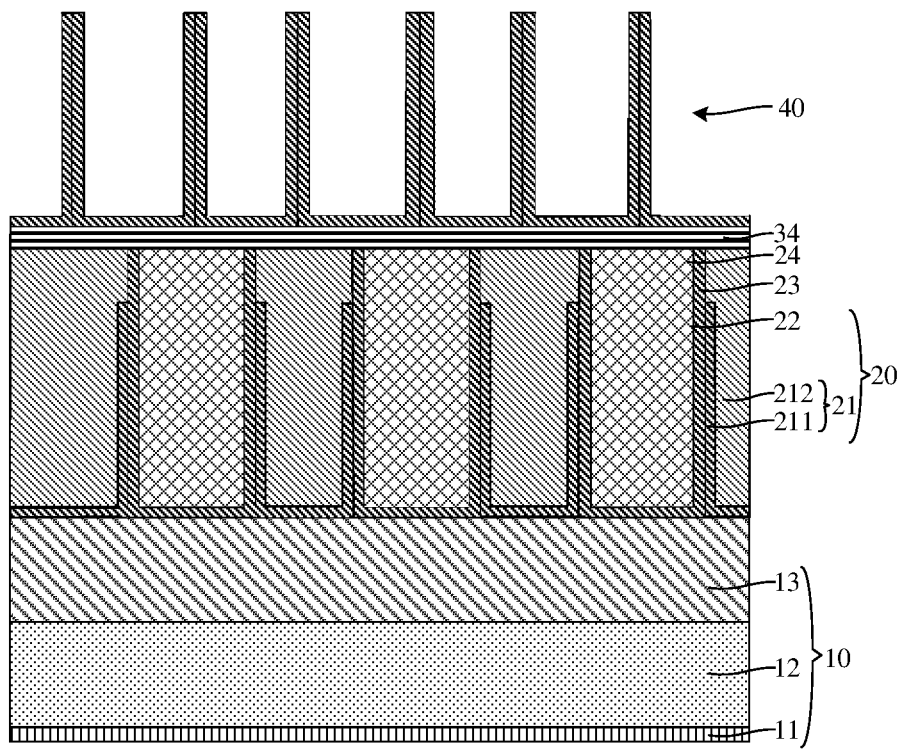

As an example, referring to FIG. 20, in one embodiment of the disclosure, S6 includes the following operation.

In S62, the second patterned photoresist layer 312 and the fourth insulating layer 33 on the surface of the second patterned photoresist layer 312 are removed through a dry etching process. A remaining portion of the third insulating layer 311 and a remaining portion of the fourth insulating layer 33 form the first pattern structure 40.

Figure 21A:
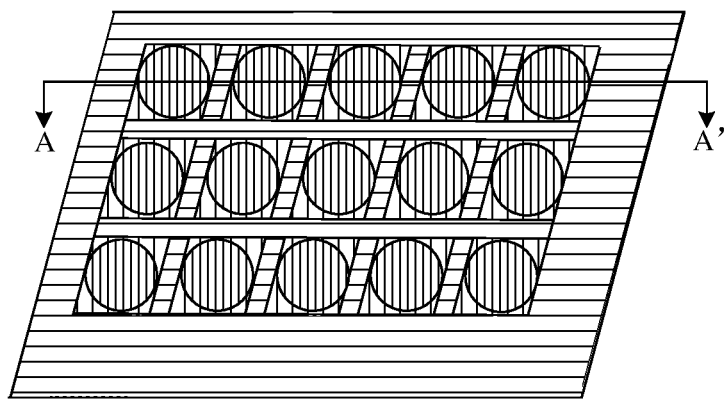
Figure 21B:
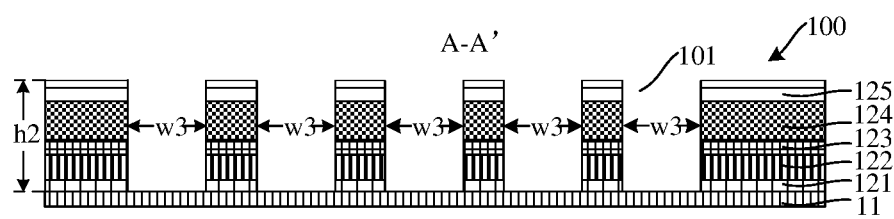

As an example, referring to FIG. 21A and FIG. 21B, in one embodiment of the disclosure, S7 includes the following operation.

The first mask pattern 20, the first mask layer 13, and a portion of the first dielectric layer 12 are etched by using the first pattern structure 40 as a mask, so as to form a capacitor hole structure 100.

Further, referring to FIG. 21A and FIG. 21B, one embodiment of the disclosure provides a semiconductor structure, which may be prepared by the method for preparing the semiconductor structure described in any one of the embodiments of the disclosure. The semiconductor structure includes a base 11, a first support layer 121, a second dielectric layer 122, a second support layer 123, a third dielectric layer 124, and a third support layer 125 sequentially stacked onto one another. The first support layer 121 includes, but is not limited to, a silicon boron nitride (SiBN) layer, the second dielectric layer 122 includes, but is not limited to, a Boro Phospho Silicate Glass (BPSG) layer, the second support layer 123 includes, but is not limited to, a silicon carbon nitride (SiCN) layer, the third dielectric layer 124 includes, but is not limited to, a High Density Plasma (HDP) layer, and the third support layer 125 includes, but is not limited to, a silicon carbon nitride (SiCN) layer. In the process of forming the capacitor hole structure 100 by etching, the third support layer 125, the third dielectric layer 124, the second support layer 123, the second dielectric layer 122, and the first support layer 121 are sequentially etched, so as to form the etching holes as the capacitor holes 101. The size of each capacitor hole 101 is the same. As illustrated in FIG. 21A and FIG. 21B, a width of each capacitor hole 101 is w3, and a height of each capacitor hole 101 is h2, so that each capacitor hole 101 has good uniformity.

According to the method for preparing the semiconductor structure and the semiconductor structure in the foregoing embodiments, firstly, the substrate 10 is provided, which includes the base 11, the first dielectric layer 12 and the first mask layer 13 sequentially stacked onto one another. The first mask pattern 20 is then formed on the substrate 10. The first mask pattern 20 includes the first mask structures 21 spaced apart from each other and first trench structures 22 exposing the substrate 10, and each of the first trench structures 22 is arranged between two adjacent first mask structures 21. Each of the first mask structures 21 includes the first insulating layer 211 and the first patterned photoresist layer 212. The first insulating layer 211 is arranged between the first patterned photoresist layer 212 and the first mask layer 13 and covers a portion of the side wall of the first patterned photoresist layer 212. The second insulating layer 23 is then formed, which covers the upper surface of the first mask pattern 20 and the bottom portion and the side wall of each of the first trench structures 22. The thickness of the second insulating layer 23 is the same as the thickness of the first insulating layer 211. The second mask pattern 30 is then formed on the first mask pattern 20. The second mask pattern 30 includes the second mask structures 31 spaced apart from each other and the second trench structures 32 exposing a portion of the first mask pattern 20. Each of the second trench structure 32 is arranged between two adjacent second mask structures 31. The extension direction of the orthogonal projection of each second trench structure 32 on the surface of the substrate 10 obliquely crosses the extension direction of the orthogonal projection of each first trench structure 22 on the surface of the substrate 10. Each of the second mask structures 31 includes the third insulating layer 311 and the second patterned photoresist layer 312. The third insulating layer 311 is arranged between the second patterned photoresist layer 312 and the first mask pattern 20, and covers a portion of the side wall of the second patterned photoresist layer 312. The fourth insulating layer 33 is then formed. The fourth insulating layer 33 covers the surface of the second patterned photoresist layer 312 and the bottom portion and the side wall of each of the second trench structures 32. The thickness of the fourth insulating layer 33 is the same as the thickness of the third insulating layer 311. The second patterned photoresist layer 312 is then removed, so as to form the first pattern structure 40. The portion of the first mask pattern 20, the first mask layer 13, and the portion of the first dielectric layer 12 are etched by using the first pattern structure 40 as a mask, so as to form the capacitor hole structure 100. Since the thickness of the first insulating layer 211 is equal to the thickness of the second insulating layer 23, and the thickness of the third insulating layer 311 is equal to the thickness of the fourth insulating layer 33, the loading effect is avoided in the process of etching and forming the capacitor hole structure 100 by using the first pattern structure 40 as a mask, thereby ensuring the yield of the capacitor tube structure of the capacitor.

Please note that the foregoing embodiments are only for illustrative purposes and are not intended to limit the disclosure.

It should be understood that, the steps are not performed in the exact order shown and may be performed in other orders unless otherwise indicated herein. Moreover, at least a portion of the steps of the abovementioned steps may include multiple sub-steps or multiple stages, which are not necessarily performed at the same time, but may be performed at different times, and the order of execution is not necessarily sequential, but may be performed in turns or alternately with other steps or at least a portion of the sub-steps or stages of other steps.

Respective embodiments in the description are described in a progressive manner, and each embodiment focuses on the difference from other embodiments, and the same or similar parts among the various embodiments are referenced to each other.

The technical features of the embodiments described above can be arbitrarily combined. In order to make the description simple, not all the possible combinations of the technical features in the above embodiments are completely described. However, all of the combinations of these technical features should be considered as within the scope described in the present specification as long as there is no contradiction in the combinations of these technical features.

The above embodiments merely illustrate several implementations of the disclosure, and the description thereof is specific and detailed, but they are not constructed as limiting the patent scope of the disclosure. It should be noted that a number of variations and improvements made by those of ordinary skill in the art without departing from the conception of the disclosure are within the protection scope of the disclosure. Therefore, the patent protection scope of the disclosure should be subjected to the appended claims.

The invention claimed is:

1. A method for preparing a semiconductor structure, comprising:
   providing a substrate, wherein the substrate comprises a base, and a first dielectric layer and a first mask layer sequentially formed;
   forming a first mask pattern on the substrate, wherein the first mask pattern comprises first mask structures spaced apart from each other and first trench structures exposing the substrate, each of the first trench structures is arranged between two adjacent first mask structures, each of the first mask structures comprises a first insulating layer and a first patterned photoresist layer, and the first insulating layer is arranged between the first patterned photoresist layer and the first mask layer and covers a portion of a side wall of the first patterned photoresist layer;
   forming a second insulating layer, wherein the second insulating layer covers an upper surface of the first mask pattern and a bottom portion and a side wall of each of the first trench structures, and a thickness of the second insulating layer is the same as a thickness of the first insulating layer;
   forming a first filling material layer, wherein the first filling material layer covers a surface of the second insulating layer, and the first filling material layer and the second insulating layer fill the first trench structures;
   removing a portion of the first filling material layer and the second insulating layer on an upper surface of the first patterned photoresist layer to form a first filling layer, wherein an upper surface of the first filling layer is flush with the upper surface of the first patterned photoresist layer;
   forming a first polysilicon layer on the first filling layer, wherein the first polysilicon layer covers the upper surface of the first filling layer and the upper surface of the first patterned photoresist layer;
   forming a second mask pattern on the first mask pattern, wherein the second mask pattern comprises second mask structures spaced apart from each other and second trench structures exposing a portion of the first polysilicon layer, each of the second trench structures is arranged between two adjacent second mask structures, each of the second mask structures comprises a third insulating layer and a second patterned photoresist layer, the third insulating layer is arranged between the second patterned photoresist layer and the first mask pattern, and the third insulating layer covers a portion of a side wall of the second patterned photoresist layer;
   forming a fourth insulating layer, wherein the fourth insulating layer covers a surface of the second patterned photoresist layer and a bottom portion and a side wall of each of the second trench structures, and a thickness of the fourth insulating layer is the same as a thickness of the third insulating layer;
   removing the second patterned photoresist layer and the fourth insulating layer on the surface of the second patterned photoresist layer to form a first pattern structure; and
   etching the first mask pattern, the first mask layer, and a portion of the first dielectric layer by using the first pattern structure as a mask.

2. The method for preparing the semiconductor structure of claim 1, wherein forming the first mask pattern on the substrate comprises:
   forming a first sacrificial layer on the substrate, wherein the first sacrificial layer comprises third trench structures exposing the first mask layer;
   forming a first initial insulating layer, wherein the first initial insulating layer covers an upper surface of the first sacrificial layer and a bottom portion and a side wall of each of the third trench structures;
   forming a first photoresist layer, wherein the first photoresist layer covers a surface of the first initial insulating layer and fills the third trench structures;
   patterning the first photoresist layer to form the first patterned photoresist layer; and
   etching a portion of the first initial insulating layer and the first sacrificial layer by using the first patterned photoresist layer as a mask to form each of the first trench structures, wherein a remaining portion of the first initial insulating layer forms the first insulating layer.

3. The method for preparing the semiconductor structure of claim 2, wherein forming the first initial insulating layer comprises:
   forming the first initial insulating layer through an atomic layer deposition process, wherein a material of the first initial insulating layer comprises silicon oxide.

4. The method for preparing the semiconductor structure of claim 1, wherein forming the second insulating layer comprises:
   forming the second insulating layer through an atomic layer deposition process, wherein a material of the second insulating layer comprises silicon oxide.

5. The method for preparing the semiconductor structure of claim 1, wherein forming the second mask pattern on the first mask pattern comprises:
   forming a second sacrificial layer on the first polysilicon layer, wherein the second sacrificial layer comprises fourth trench structures exposing the first polysilicon layer;
   forming a second initial insulating layer, wherein the second initial insulating layer covers an upper surface of the second sacrificial layer and a bottom portion and a side wall of each of the fourth trench structures;
   forming a second photoresist layer, wherein the second photoresist layer covers a surface of the second initial insulating layer and fills the fourth trench structures;
   patterning the second photoresist layer to form the second patterned photoresist layer; and
   etching a portion of the second initial insulating layer and the second sacrificial layer by using the second patterned photoresist layer as a mask, wherein a remaining portion of the second initial insulating layer forms the third insulating layer.

6. The method for preparing the semiconductor structure of claim 5, wherein an etching selectivity ratio of the second initial insulating layer to the first polysilicon layer is greater than 10:1 under a same etching condition.

7. The method for preparing the semiconductor structure of claim 6, wherein forming the second initial insulating layer comprises:
   forming the second initial insulating layer through an atomic layer deposition process, wherein a material of the second initial insulating layer comprises silicon oxide.

8. The method for preparing the semiconductor structure of claim 1, wherein after forming the fourth insulating layer and before removing the second patterned photoresist layer and the fourth insulating layer on a surface of the second patterned photoresist layer, the method further comprises:
   forming a second filling layer, wherein the second filling layer covers a surface of the fourth insulating layer, and the second filling layer and the fourth insulating layer fill the second trench structures.

9. The method for preparing the semiconductor structure of claim 1, wherein forming the first pattern structure comprises:
   removing the second patterned photoresist layer and the fourth insulating layer on a surface of the second patterned photoresist layer through a dry etching process, wherein a remaining portion of the third insulating layer and a remaining portion of the fourth insulating layer form the first pattern structure.

10. The method for preparing the semiconductor structure of claim 1, wherein forming the fourth insulating layer comprises:
    forming the fourth insulating layer through an atomic layer deposition process, wherein a material of the fourth insulating layer comprises silicon oxide.

11. The method for preparing the semiconductor structure of claim 1, wherein the first dielectric layer comprises a first support layer, a second dielectric layer, a second support layer, a third dielectric layer, and a third support layer sequentially stacked onto one another.

\* \* \* \* \*